United States Patent
Takeda et al.

(10) Patent No.: US 11,973,159 B2
(45) Date of Patent: Apr. 30, 2024

(54) PHOTODETECTOR

(71) Applicant: Nippon Telegraph and Telephone Corporation, Tokyo (JP)

(72) Inventors: Kotaro Takeda, Musashino (JP); Kiyofumi Kikuchi, Musashino (JP); Yoshiho Maeda, Musashino (JP); Tatsuro Hiraki, Musashino (JP)

(73) Assignee: NIPPON TELEGRAPH AND TELEPHONE CORPORATION, Tokyo (JP)

( * ) Notice: Subject to any disclaimer, the term of this patent is extended or adjusted under 35 U.S.C. 154(b) by 170 days.

(21) Appl. No.: 17/633,717

(22) PCT Filed: Aug. 28, 2019

(86) PCT No.: PCT/JP2019/033776
§ 371 (c)(1),
(2) Date: Feb. 8, 2022

(87) PCT Pub. No.: WO2021/038768
PCT Pub. Date: Mar. 4, 2021

(65) Prior Publication Data
US 2022/0320361 A1 Oct. 6, 2022

(51) Int. Cl.
*H01L 31/107* (2006.01)
*H01L 31/0232* (2014.01)
(Continued)

(52) U.S. Cl.
CPC .... *H01L 31/1075* (2013.01); *H01L 31/02327* (2013.01); *H01L 31/028* (2013.01); *H01L 31/035272* (2013.01)

(58) Field of Classification Search
CPC ........... H01L 31/1075; H01L 31/02327; H01L 31/028; H01L 31/035272; H01L 31/11;
(Continued)

(56) References Cited

U.S. PATENT DOCUMENTS 7,397,101 B1 *  7/2008  Masini ................. G02B 6/4295
                                                                257/656
7,453,132 B1 * 11/2008  Gunn, III ............ H01L 31/0232
                                                                257/448
(Continued)

FOREIGN PATENT DOCUMENTS

JP    2017-147352 A    8/2017
JP    2018-082089 A    5/2018

OTHER PUBLICATIONS

B. Wang, Z. Huang, X. Zeng, D. Liang, M. Fiorentino and R. G. Beausoleil, "35Gb/s Ultralow-Voltage Three-Terminal Si—Ge Avalanche Photodiode," 2019 Optical Fiber Communications Conference and Exhibition (OFC), San Diego, CA, USA, 2019, pp. 1-3. (Mar. 3-7, 2019) (Year: 2019).*

(Continued)

*Primary Examiner* — Sitaramarao S Yechuri
(74) *Attorney, Agent, or Firm* — Workman Nydegger

(57) ABSTRACT

Provided is a photodetector which can be manufactured in a standard process of a mass-produced CMOS foundry. The photodetector includes a silicon (Si) substrate; a lower clad layer; a core layer including a waveguide layer configured to guide signal light, and including a first Si slab doped with first conductive impurity ions and a second Si slab doped with second conductive impurity ions; a germanium (Ge) layer configured to absorb light and including a Ge region doped with the first conductive impurity ions; an upper clad layer; and electrodes respectively connected to the first and second Si slabs and the Ge region. A region of the core layer sandwiched between the first Si slab and the second Si slab operates as an amplification layer.

5 Claims, 12 Drawing Sheets

(51) Int. Cl.
*H01L 31/028* (2006.01)
*H01L 31/0352* (2006.01)

(58) Field of Classification Search
CPC ...... G02B 6/12004; G02B 2006/12123; G02B 2006/12195
See application file for complete search history.

(56) References Cited

U.S. PATENT DOCUMENTS

| | | | |
|---|---|---|---|
| 9,391,225 B1* | 7/2016 | Davids | G02B 6/12004 |
| 2012/0126286 A1* | 5/2012 | Na | H01L 31/02005 |
| | | | 250/371 |
| 2015/0076641 A1* | 3/2015 | Huang | H01L 31/107 |
| | | | 257/438 |
| 2016/0155863 A1* | 6/2016 | Baehr-Jones | H01L 27/14649 |
| | | | 438/69 |
| 2018/0294365 A1* | 10/2018 | Fei | G02B 6/12 |
| 2019/0165200 A1* | 5/2019 | Masini | H01L 31/107 |
| 2019/0378949 A1* | 12/2019 | Simoyama | H01L 31/105 |
| 2020/0203548 A1* | 6/2020 | Zeng | H01L 31/1804 |
| 2020/0393618 A1* | 12/2020 | Novack | H01L 31/02327 |
| 2021/0066529 A1* | 3/2021 | Lu | H01L 27/14643 |

OTHER PUBLICATIONS

OFC schedule (Year: 2019).*

Wang, Binhao et al., *35Gb/s Ultralow-Voltage Three-Terminal Si—Ge Avalanche Photodiode*, 2019 Optical Fiber Communications Conference and Exhibition (OFC) [online], Apr. 25, 2019 [retrieved on Oct. 21, 2019], Retrieved from the Internet: <URL: https://ieeexplOre.ieee.org/document/8696313>/, fig.1, pp. 1-4.

Zhihong Huang, et al., *Low Voltage High Speed Si—Ge Avalanche Photodiodes*, ThD3-2, OECC/PS2016, 2016, pp. 1-3.

Tsung-Yang Liow, et al., *Waveguide Ge/Si Avalanche Photodetector with a Unique Low-Height-Profile Device Structure*, M2G.6.pdf, OFC 2014, OSA 2014, pp. 1-3.

* cited by examiner

PHOTODETECTOR

TECHNICAL FIELD

The present invention relates to a photodetector, and more particularly to a photodetector particularly made by germanium, which is used in an optical communication system, an optical information processing system, or the like.

BACKGROUND ART

With the spread of optical communication in recent years, there is a demand for cost reduction of optical communication devices. As one solution thereto, there is a known method of forming, on a silicon wafer with a large diameter, an optical circuit constituting an optical communication device using a micro optical circuit technique based on silicon photonics. Thus, a material cost per chip can be dramatically reduced, and a cost of the optical communication device can be reduced. A photodetector formed on a silicon (Si) substrate using such a technique includes a germanium photodiode (GePD) in which monolithic integration is possible.

FIG. 1 shows a structure of a waveguide-coupled vertical GePD of the related art. FIG. 2 is a cross-sectional view of the vertical GePD of FIG. 1 taken along the reference sign II-II. A vertical GePD 100 is formed on a silicon on insulator (SOI) substrate including a Si substrate, a Si oxide film, and a surface Si layer using a lithography technique or the like. The vertical GePD 100 includes a Si substrate 101, a lower clad layer 102 formed of a Si oxide film on the Si substrate, a silicon core layer 110 which guides signal light, a Ge layer 114 which absorbs light formed on the core layer 110, and an upper clad layer 103 formed on the core layer 110 and the Ge layer 114. The core layer 110 is divided into a waveguide layer 141 and a silicon slab 142.

In the silicon slab 142, a p-type Si slab 111 doped with first conductive impurity ions and silicon electrode portions 112 and 113 doped with the first conductive impurity ions in a high concentration and serving as electrodes are formed. The Ge layer 114 is laminated by epitaxial growth, and a Ge region 115 doped with second conductive impurity ions is formed on the Ge layer 114. The Ge layer 114 may be of a germanium compound. Electrodes 116 to 118 are formed on the silicon electrode portions 112 and 113 and the Ge region 115, respectively, to come into contact with the silicon electrode portions 112 and 113 and the Ge region 115.

In order to make a structure easy to understand, FIG. 1 is a top view in which the upper clad layer 103 is omitted and shows only positions at which the electrodes 116 to 118 are in contact with the silicon electrode portions 112 and 113 and the Ge region 115.

In the vertical GePD 100, when light is incident on the silicon slab 142 from the waveguide layer 141 and is absorbed by the Ge layer 114, a photocurrent flows between an electrode 117 and the electrodes 116 and 118. The light is detected by detecting this photocurrent.

To improve GePD sensitivity, a GeAPD converted to an avalanche photodiode (APD) is known. FIG. 3 shows a first example of a waveguide-coupled GeAPD of the related art. A difference in a GeAPD 200 from the vertical GePD shown in FIG. 2 is that an intrinsic Si layer 119 is added between the p-type Si slab 111 and the Ge layer 114. FIG. 4 shows a second example of the waveguide-coupled GeAPD of the related art. Furthermore, in a GeAPD 300, a Si layer 120 doped with second conductive impurity ions is added between the intrinsic Si layer 119 and the Ge layer 114. In the GeAPDs 200 and 300, the intrinsic Si layer 119 serves as an amplification layer, and the Ge layer 114 serves as a light absorbing layer.

In the GeAPD 300, an amount of impurities in the Ge region 115 doped with the second conductive impurity ions, the Si slab 111 doped with the first conductive impurity ions, and the Si layer 120 doped with the second conductive impurity ions, can be adjusted, and an electric field is concentrated on the intrinsic Si layer 119, and avalanche amplification is caused. The Ge layer 114 causes a weaker electric field, which is an electric field sufficient to draw the carriers generated from the light absorption, than in the intrinsic Si layer 119 to be applied. The carriers generated from the light absorption by the Ge layer 114 are avalanche amplified through the intrinsic Si layer 119 (refer to, for example, NPL 1).

FIG. 5 shows a third example of the waveguide-coupled GeAPD of the related art. In the core layer 110 of a GeAPD 400, separately from the p-type Si slab 111 doped with the first conductive impurity ions and the silicon electrode portion 112 serving as an electrode, a p-type Si slab 122 doped with the second conductive impurity ions and a silicon electrode portion 121 serving as an electrode are formed, and the silicon electrode portion 112 is connected to an electrode 116 and the silicon electrode portion 121 is connected to an electrode 125.

When a voltage is applied between the electrode 116 and the electrode 125, the electric field is applied between the p-type Si slab 111 and the p-type Si slab 122 via a path 123 passing through the Ge layer 114 and a path 124 passing through the core layer 110. The electric field is stronger in the path 124 than in the path 123. It is designed that the electric field applied to the path 124 causes avalanche amplification in the core layer 110 by adjusting a thickness or a size of the Ge layer 114, a gap between the p-type Si slab 111 and the p-type Si slab 122, and the like, and the electric field applied to the path 123 draws the carriers generated from the light absorption by the Ge layer 114. The carriers generated from the light absorption by the Ge layer 114 are avalanche amplified through the core layer 110 (refer to, for example, NPL 2).

The GeAPD of the related art serves as an APD by satisfying the following three points:

1) A strong electric field sufficient to cause avalanche amplification is applied to a silicon amplification layer;
2) An electric field which is relatively weaker than the electric field applied to the silicon amplification layer is applied to an extent that the carriers are drawn from germanium which is a light absorbing layer; and
3) The carriers drawn from the light absorbing layer are avalanche-amplified through the silicon amplification layer.

The production of the GeAPD shown in FIGS. 3 to 5 has a problem in which a special process is required as compared with the GePD. In the GeAPD shown in FIGS. 3 and 4, the intrinsic Si layer 119 is required to have a thickness of approximately 0.1 to 1 μm. Since the p-type Si slab 111 doped with the first conductive impurity ions is required immediately below the Si layer 119, the intrinsic Si layer is disposed on an impurity-implanted layer. Therefore, after the Si slab 111 doped with the first conductive impurity ions is formed, it is necessary to grow the intrinsic Si layer 119 so that impurities do not diffuse. Alternatively, after the core layer 110 is scraped into a convex shape, a special process of penetrating the intrinsic Si layer 119 and doping the first conductive impurity ions immediately underneath is required.

In the GeAPD shown in FIG. 5, the Ge layer 114 is required to have a width of 100 to 200 nm. The width of the Ge layer which can be manufactured by a general mass-produced CMOS foundry is about several μm. Therefore, there is a need to develop a special process which grows the very thin Ge layer 114.

One of advantages of silicon photonics is that it can be manufactured by a general mass-produced CMOS foundry, which is the basis for cost reduction and improvement in mass productivity. However, the GeAPD of the related art involves a special process which is not supported by the foundry in the process, and thus it is not realistic from the viewpoint of mass productivity.

CITATION LIST

Non Patent Literature

NPL 1: Zhihong Huang, et al., "Low Voltage High Speed Si—Ge Avalanche Photodiodes", ThD3-2, OECC/PS2016

NPL 2: Tsung-Yang Liow, et al., "Waveguide Ge/Si Avalanche Photodetector with a Unique Low-Height-Profile Device Structure", M2G.6.pdf, OFC 2014, OSA 2014

SUMMARY OF THE INVENTION

An object of the present invention is to provide a photodetector which can be manufactured by a standard process of a mass production CMOS foundry.

In order to achieve such an object, an embodiment of a photodetector includes a silicon (Si) substrate; a lower clad layer formed on the Si substrate; a core layer formed on the lower clad layer, the core layer including a waveguide layer configured to guide signal light, and including a first Si slab doped with first conductive impurity ions and a second Si slab doped with second conductive impurity ions; a germanium (Ge) layer formed on the core layer, the Ge layer configured to absorb light and including a Ge region doped with the first conductive impurity ions; an upper clad layer formed on the core layer and the Ge layer; and electrodes respectively connected to the first and second Si slabs and the Ge region, wherein a region of the core layer sandwiched between the first and second Si slabs operates as an amplification layer.

This configuration can be manufactured in a general mass-produced CMOS foundry, and there is no need to develop a special process.

DESCRIPTION OF EMBODIMENTS

Hereinafter, embodiments of the present invention will be described in detail with reference to the drawings.

Figure 6:
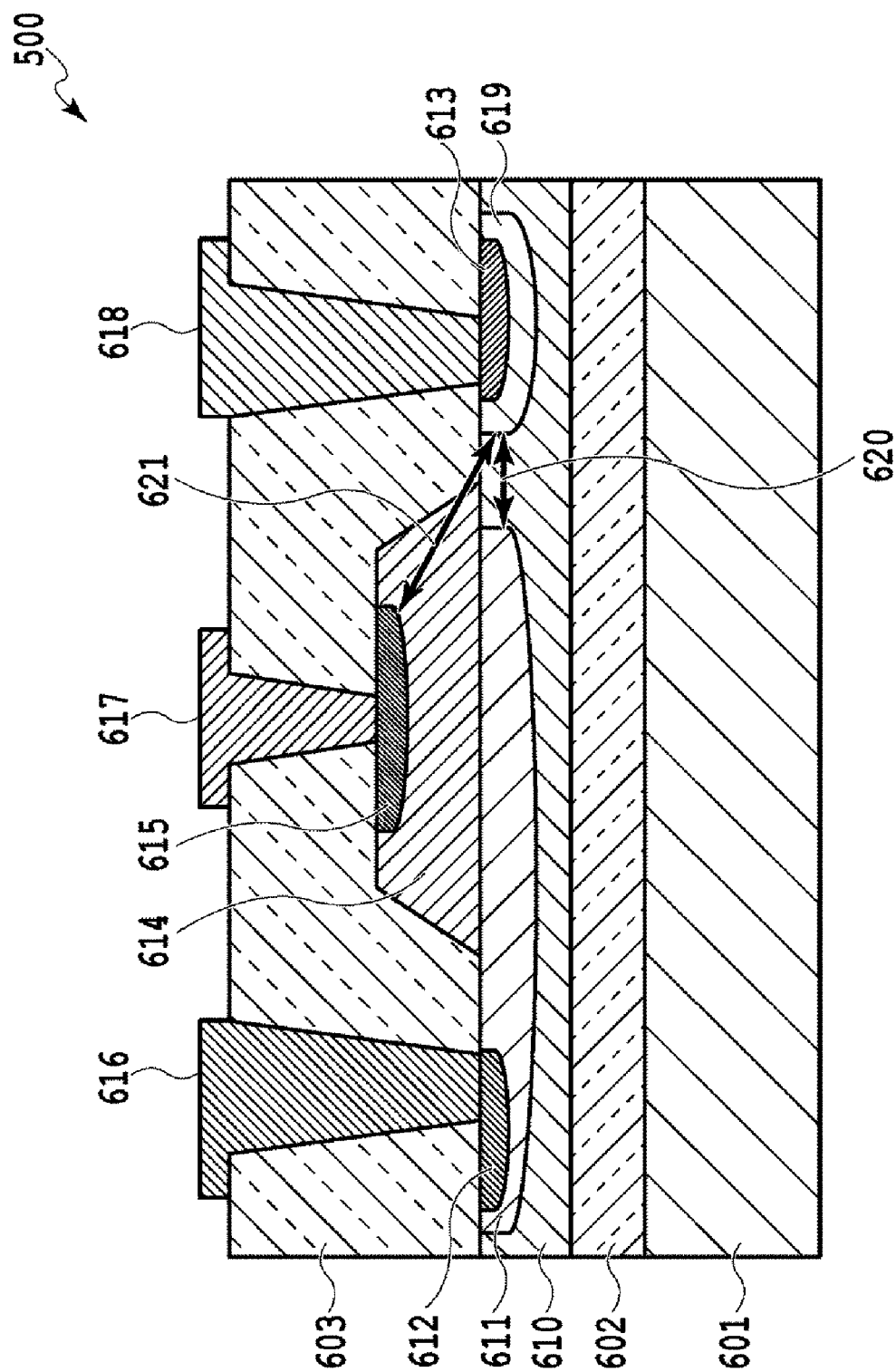
FIG. 6 is a diagram showing a configuration of a GeAPD according to an embodiment of the present invention.

FIG. 6 shows a configuration of a GeAPD according to an embodiment of the present invention. The GeAPD 500 includes a Si substrate 601, a lower clad layer 602 formed of a Si oxide film on the Si substrate, a core layer 610 including a waveguide layer which guides signal light and a slab waveguide layer, a Ge layer 614 which absorbs light formed on the core layer 610, and an upper clad layer 603 formed on the core layer 610 and the Ge layer 614.

On the core layer 610, a Si slab 611 doped with first conductive impurity ions and a silicon electrode portion 612 doped with the first conductive impurity ions in a high concentration and serving as an electrode are formed, a Si slab 619 doped with second conductive impurity ions and a silicon electrode portion 613 doped with the second conductive impurity ions in a high concentration and serving as an electrode are formed, and the silicon electrode portion 612 is connected to a metal electrode 616 and the silicon electrode portion 613 is connected to a metal electrode 618.

The Ge layer 614 also has a Ge region 615 doped with the first conductive impurity ions, and a metal electrode 617 is connected thereto. Since a gap 620 which is a region of the core layer sandwiched between the Si slabs 611 and 619 doped with the impurity ions is not doped with the impurity ions, it is intrinsic Si which serves as an amplification layer of a GeAPD.

When a voltage is applied to the electrodes 616, 617 and 618 so that reverse bias is applied to each of the layers doped with the impurity ions, an electric field is applied to the gaps 620 and 621 in FIG. 6. Light introduced from a waveguide layer of the core layer 610 which guides signal light is absorbed by the Ge layer 614 and carriers are generated. The carrier in the Ge layer 614 is drawn by an electric field centered on the gap 621, and the GeAPD 500 detects a signal as a photocurrent through the electrodes 617 and 618.

On the other hand, when the electric field applied to the gap 620 which is mainly controlled by the electrodes 616 and 618 is designed to be stronger than the electric field applied to the gap 621 and to be strong enough to cause avalanche amplification, avalanche amplification of the carriers occurs in the gap 620. The carriers generated from the light absorption by the Ge layer 614 and drawn by the electric field of the gap 621 cause avalanche amplification through the gap 620. In this way, the GeAPD 500 is operated as a photodetector.

Figure 1:
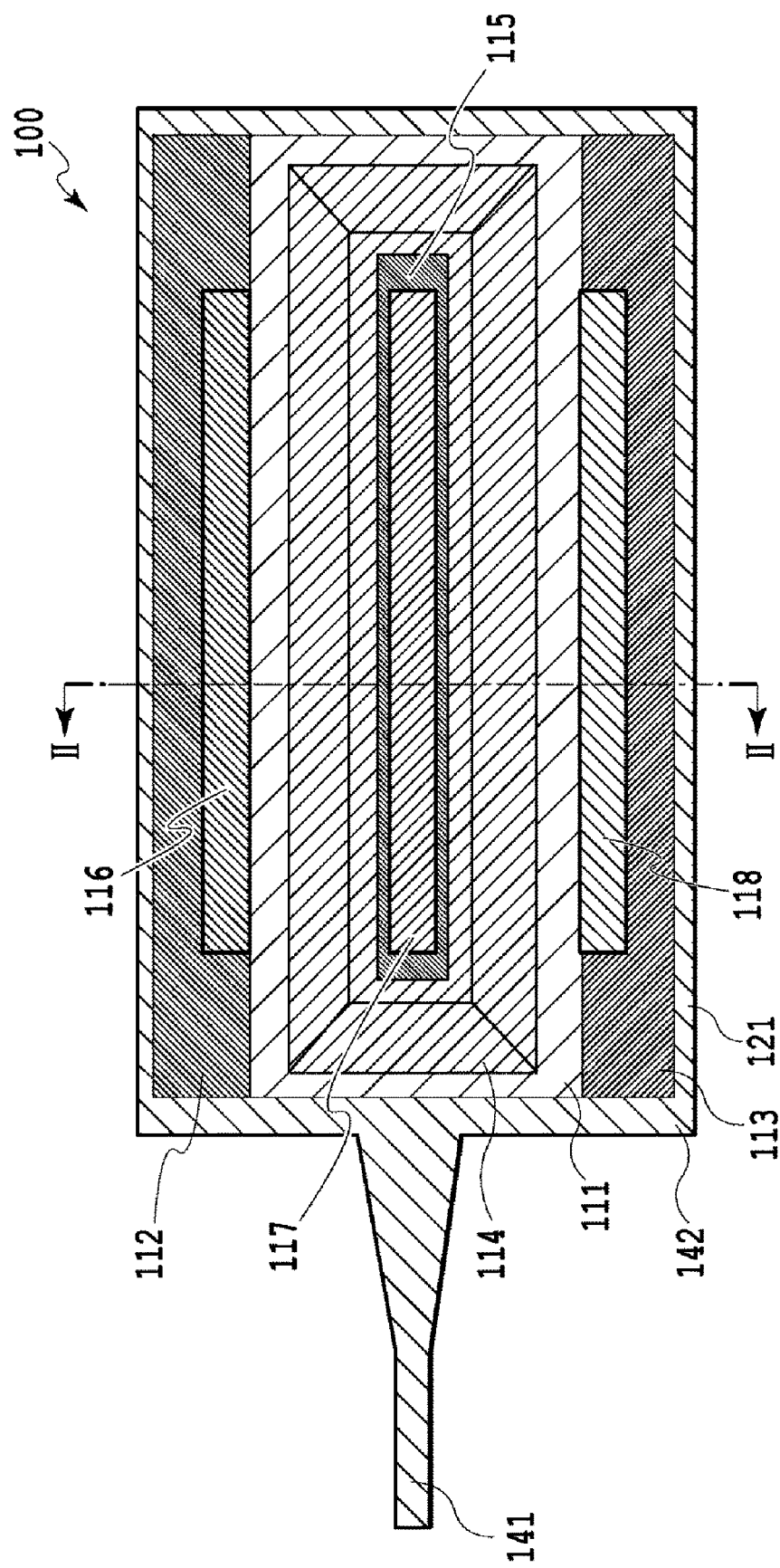
FIG. 1 is a diagram showing a structure of a waveguide-coupled vertical GePD of the related art.
Figure 2:
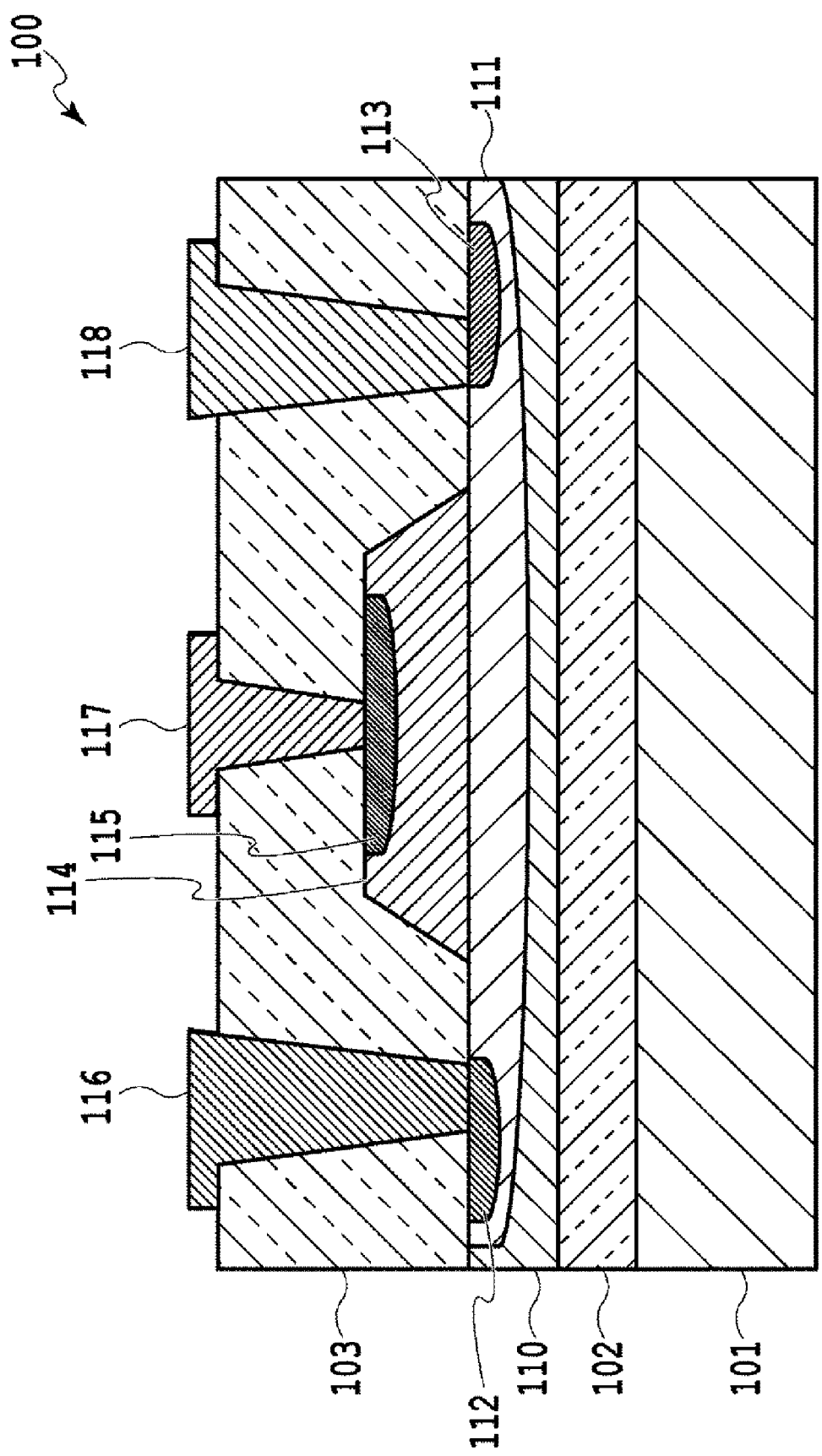
FIG. 2 is a cross-sectional view of the vertical GePD shown in FIG. 1.
Figure 3:
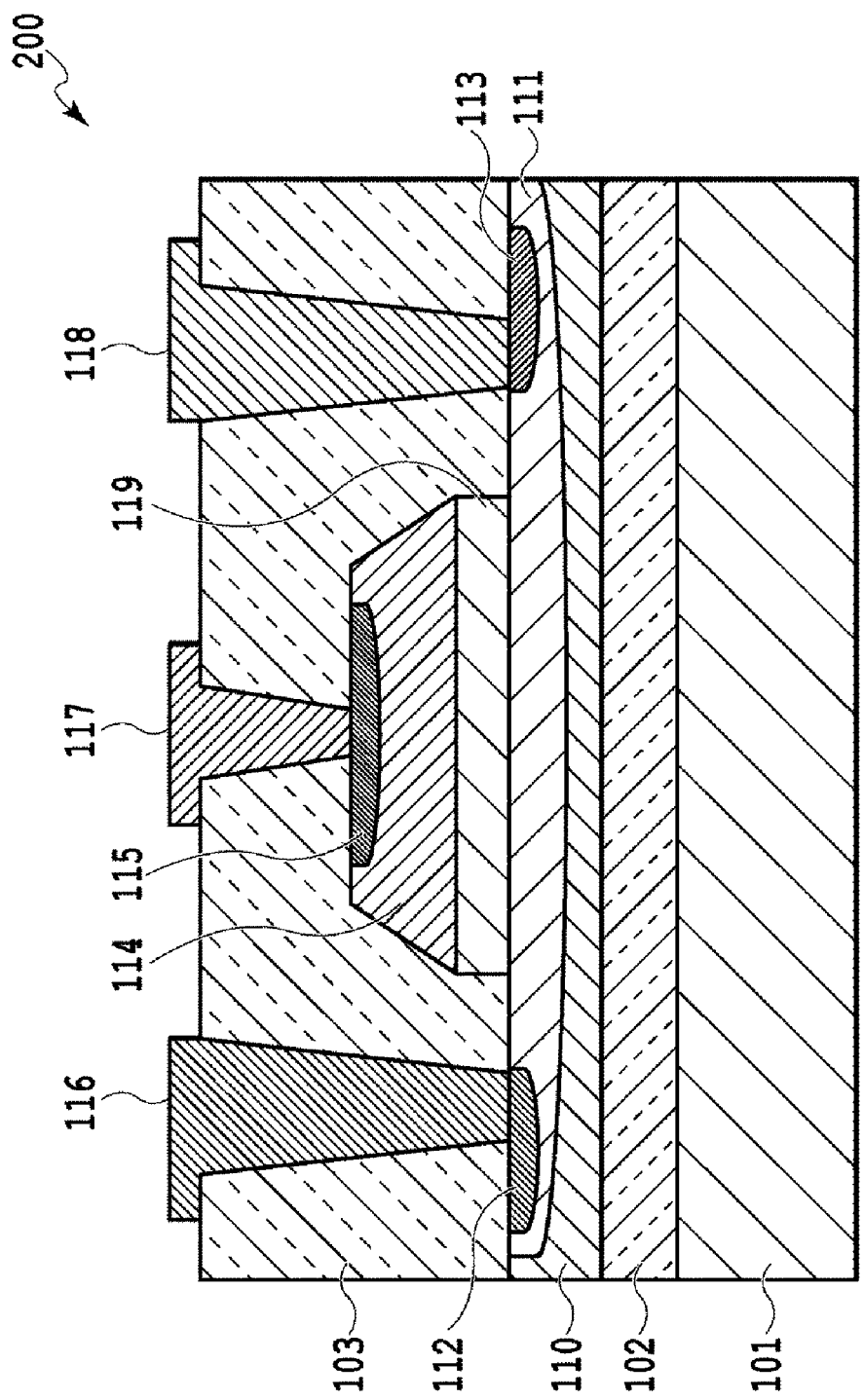
FIG. 3 is a diagram showing a first example of a waveguide-coupled GeAPD of the related art.
Figure 4:
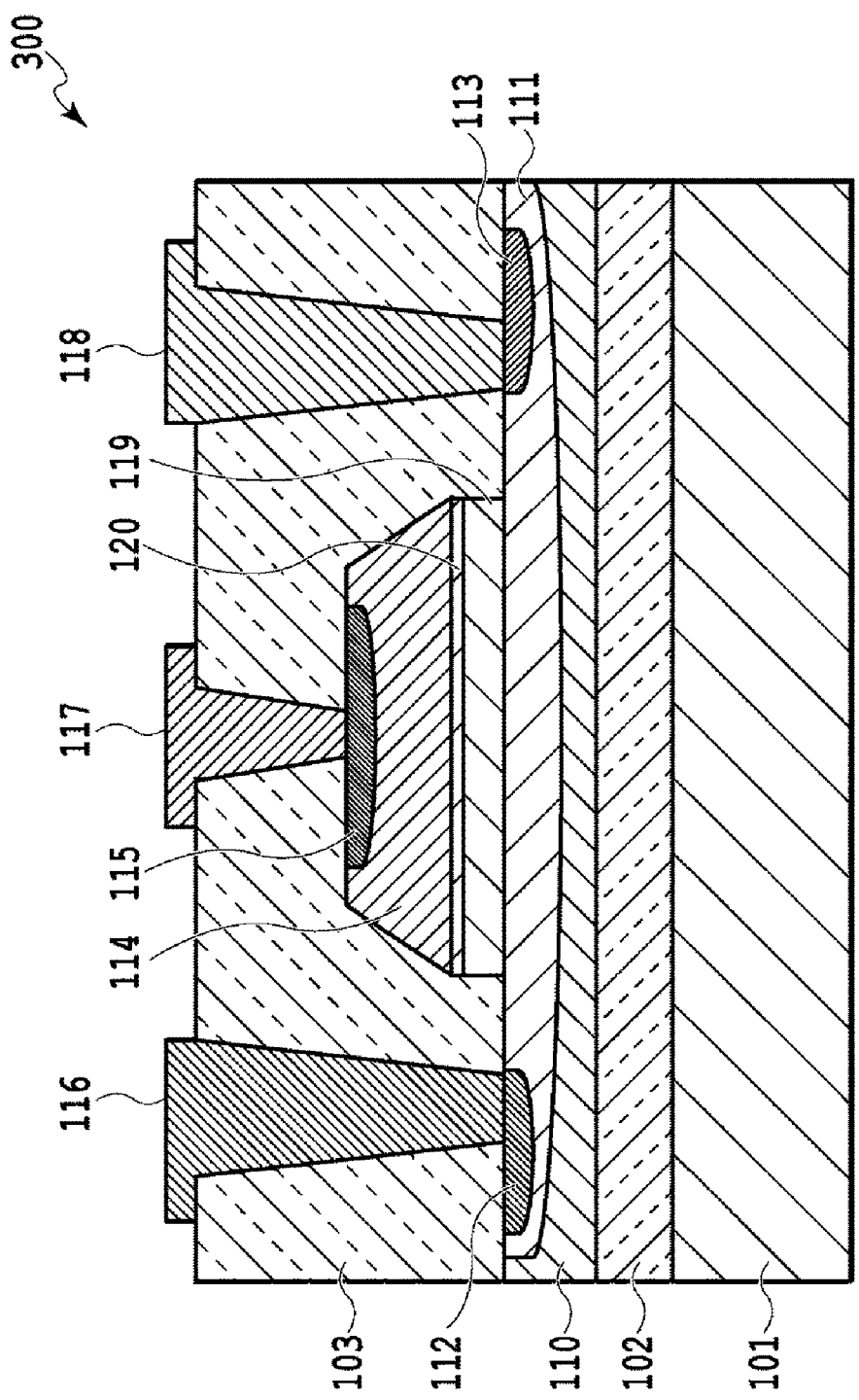
FIG. 4 is a diagram showing a second example of the waveguide-coupled GeAPD of the related art.
Figure 5:
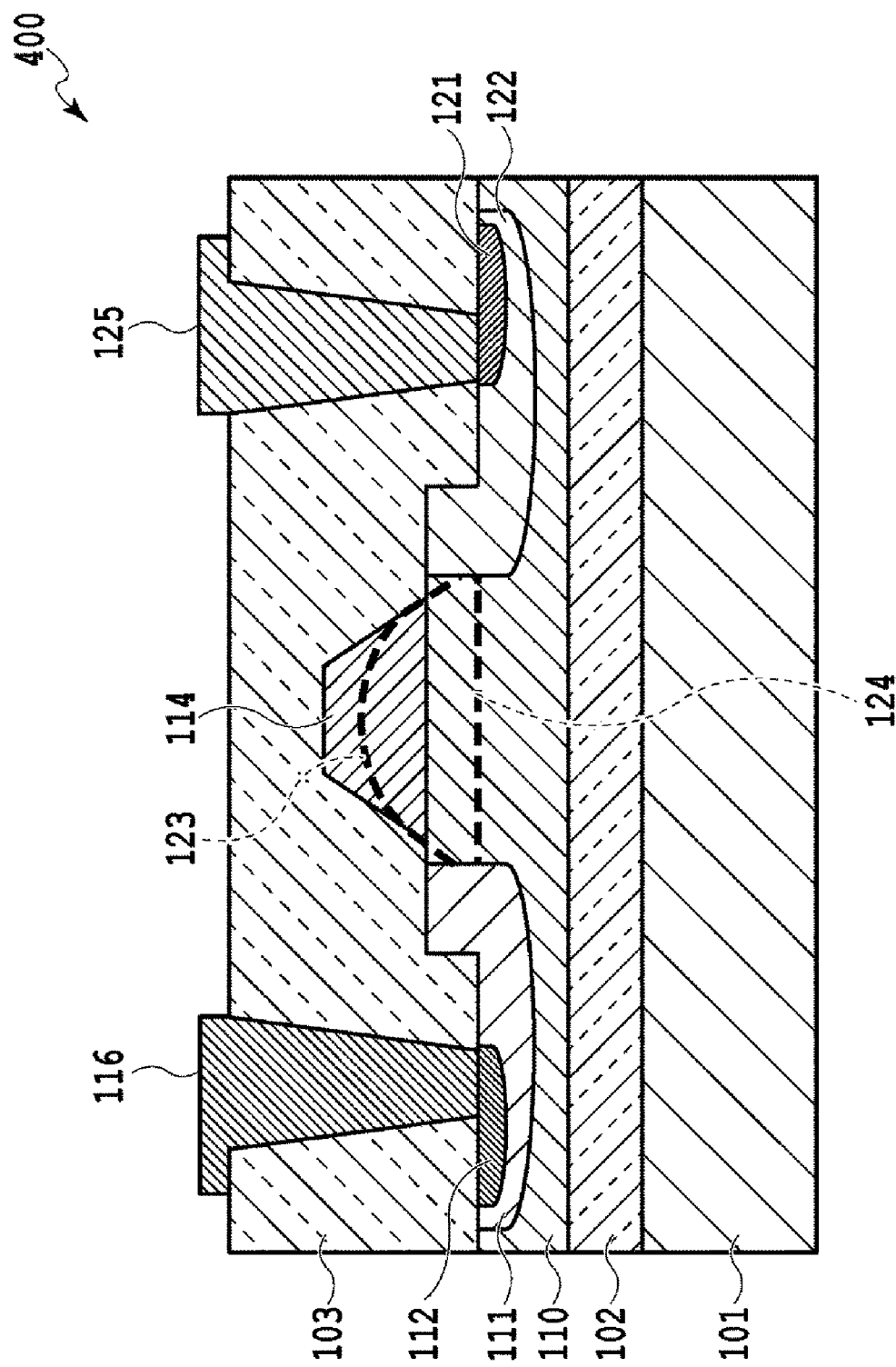
FIG. 5 is a diagram showing a third example of the vertical waveguide-coupled GeAPD of the related art.

The photodetector according to the present embodiment has a structure similar to that of the vertical GePD shown in FIG. 2, has a similar cross-sectional view, and can be manufactured by a general mass-produced CMOS foundry. Compared to the vertical GePD of the related art, it is necessary to dope the first and second conductive impurity ions into separate Si slabs, but implanting the two types of impurities into Si is a basic process of a mass-produced CMOS foundry, and the development of a special process is not required.

When a GePD is used in general silicon photonics, in most cases, electronic circuits such as an optical modulator are integrated by a CMOS process at the same time. When such different devices are manufactured in this way, doping of the two types of impurities into Si has been performed. Accordingly, the GeAPD according to the present embodiment does not require an additional photomask or manufacturing process, and thus, increase neither the development costs for special process development nor the production costs.

Example 1

Referring to the GeAPD 500 shown in FIG. 6, a GeAPD of Example 1 will be described. The gap 620 which is the region of the core layer sandwiched between the Si slabs 611 and 619 is an intrinsic Si layer and serves as an amplification layer, and the Ge layer 614 serves as a light absorbing layer. The electric field required for avalanche amplification in the Si layer is much higher than the electric field required to draw the carriers from germanium. Therefore, an operating condition of the GeAPD is that an electric field strength at the gap 620 is much higher than the electric field strength at the gap 621. In the structure of FIG. 6, the gap 620 is formed to extend over one end (one side) of a region in which the core layer 610 and the Ge layer 614 are in contact with each other. However, as long as a relationship between the voltages applied to the gap 620 and the gap 621 is maintained, a position of the gap may be anywhere.

Figure 7:
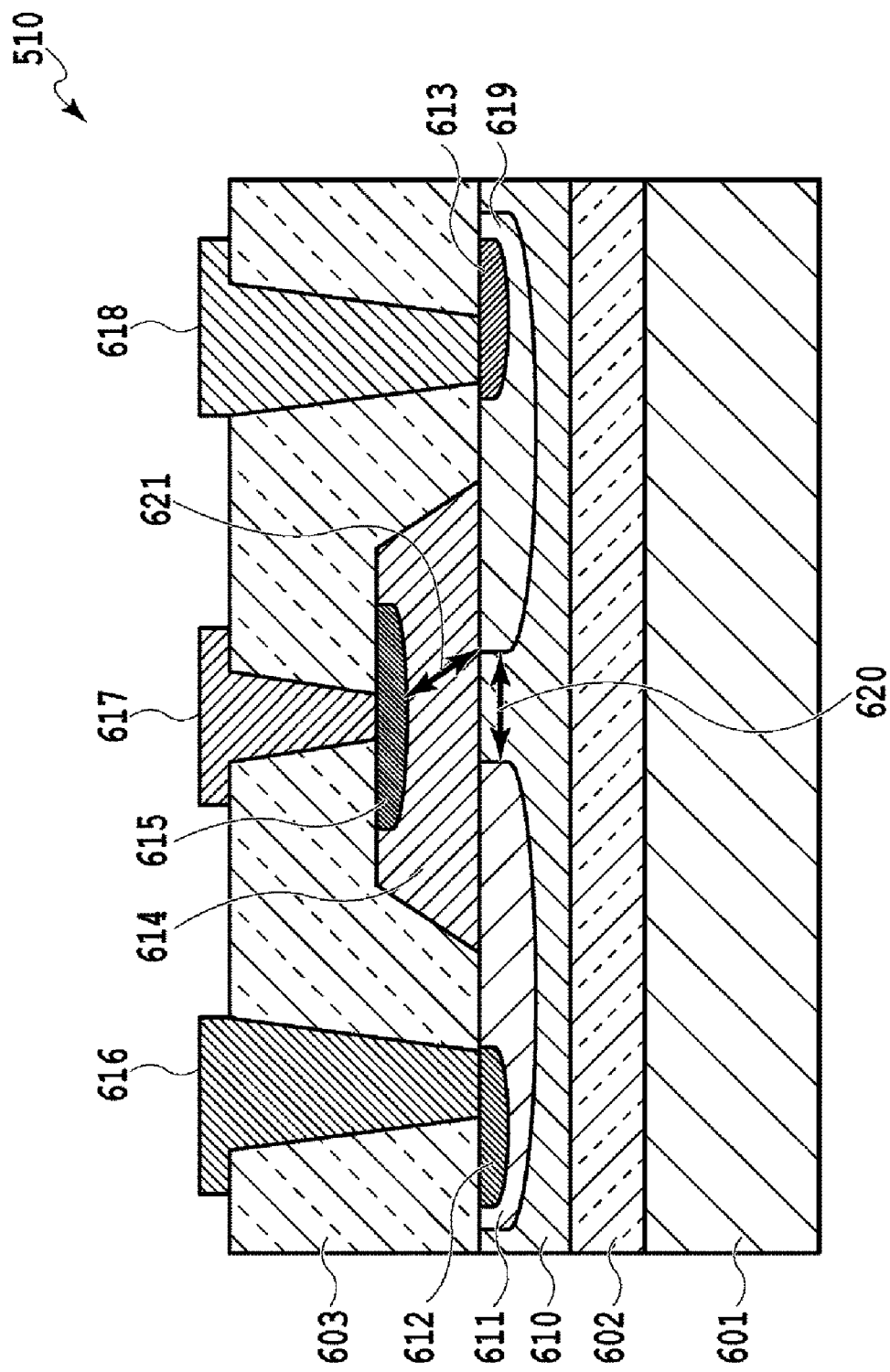
FIG. 7 is a diagram showing a first modified example of the GeAPD of Example 1.

FIG. 7 shows a first modified example of the GeAPD of Example 1. A gap 620 between Si slabs 611 and 619 of a GeAPD 510 is immediately below a region in which the core layer 610 and the Ge layer 614 are in contact with each other. A length of the gap 621 is shortened, and a difference between the length of the gap 621 and the length of the gap 620 is reduced compared to the structure of FIG. 6. Thus, the GeAPD 510 is operated by reducing the voltage applied to the electrode 617 so that the electric field strength at the gap 620 is much higher than the electric field strength at the gap 621.

Figure 8:
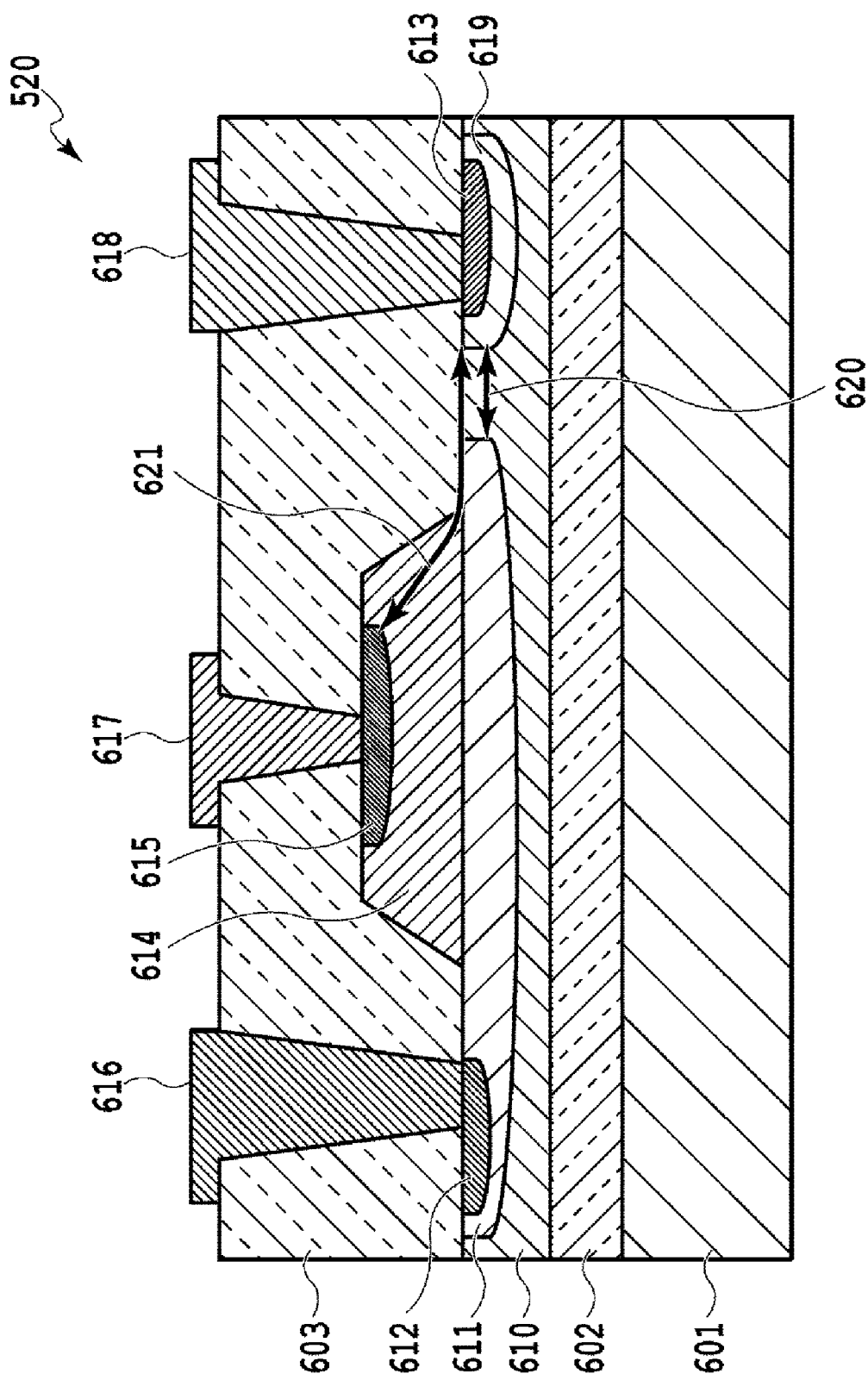
FIG. 8 is a diagram showing a second modified example of the GeAPD of Example 1.

FIG. 8 shows a second modified example of the GeAPD of Example 1. The gap 620 between Si slabs 611 and 619 of a GeAPD 520 is outside a region in which the core layer 610 and the Ge layer 614 are in contact with each other. Here, as shown in FIG. 8, the gap 621 is curved via the Si slab 611 doped with the first conductive impurity ions. In a state in which no electric field is applied to the gap 620, no electric field is applied to the gap 621. When a strong electric field is applied to the gap 620, a depletion layer opens, and one end of the depletion layer goes beyond one end of the Ge layer 614, then an electric field is applied to the gap 621.

Therefore, it can be said that this design has an increased ratio of the electric field strength applied to the gap 620 and the gap 621 compared to the structure shown in FIGS. 6 and 7. In the configuration shown in FIG. 7, when an electric field is applied to the gap 620, a strong electric field is applied to the Ge layer 614. In the operation of the GeAPD, the electric field applied to germanium which operates as the light absorbing layer is sufficiently strong to draw the carriers, and further application of an electric field leads to an increase in a dark current. Therefore, a case in which a high electric field is applied to the Ge layer 614 as in the configuration of FIG. 7 results in a reduction in performance of a device.

In the configuration shown in FIG. 6, an electric field is applied to only one end of the Ge layer 614, but in the configuration shown in FIG. 8, an electric field is not applied to the Ge layer 614 until the depletion layer in the gap 620 enters the Ge layer 614. Therefore, the gap 620 is preferably at a position far from a center of the germanium. But when the gap 620 is too far from the Ge layer 614, avalanche amplification begins at the gap 620 before the electric field is applied to the Ge layer 614. And thus, it is not true that the farther from the center of the Ge layer 614, the better the gap 620 is.

Example 2

Figure 9:
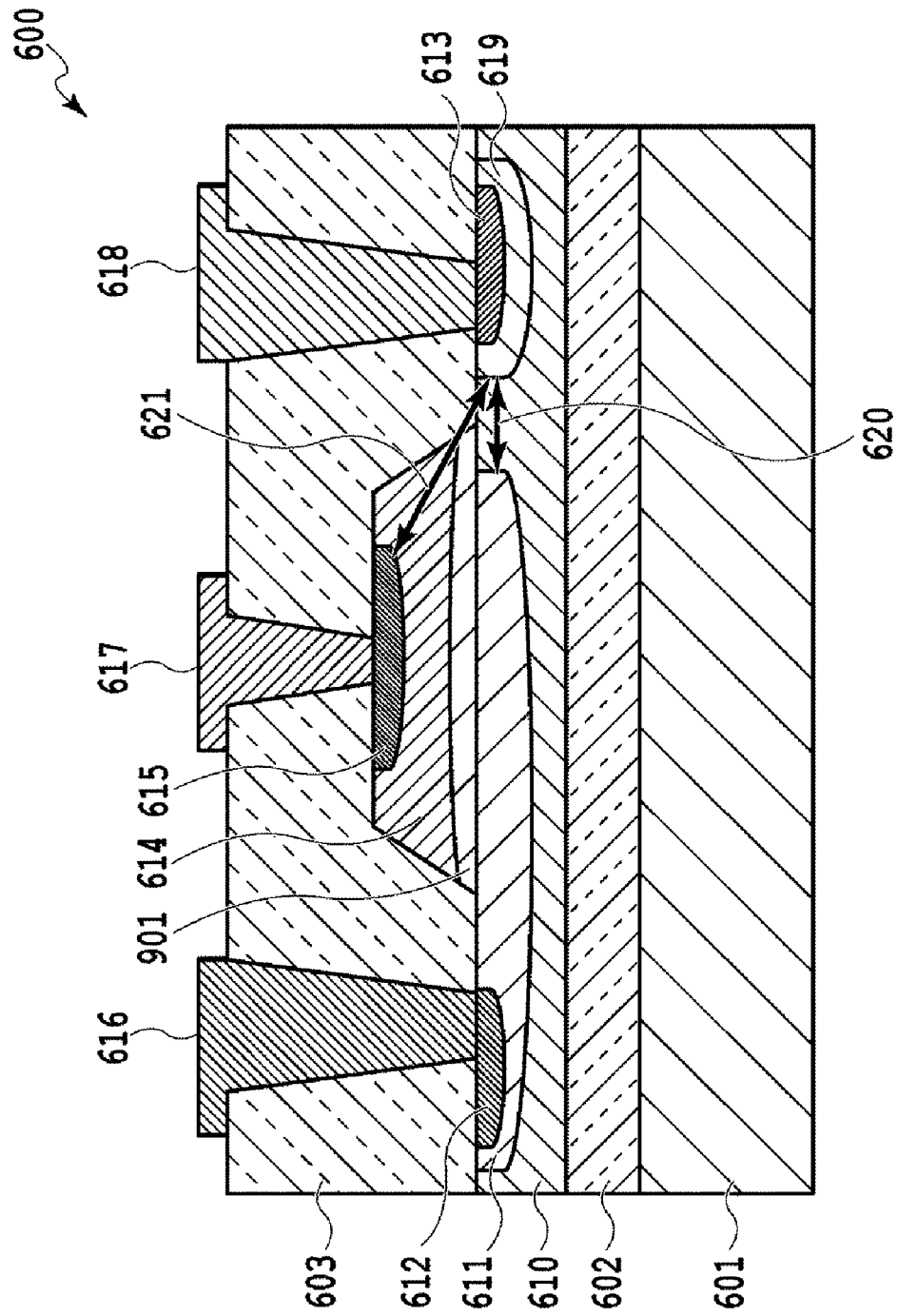
FIG. 9 is a diagram showing a configuration of a GeAPD of Example 2.

FIG. 9 shows a configuration of a GeAPD of Example 2. In the GeAPD 600, a Ge layer 901 doped with first conductive impurity ions is inserted between a Si slab 611 doped with the first conductive impurity ions and a Ge layer 614. An electric field is not applied to the gap 621 until a strong electric field is applied to the gap 620, the depletion layer opens, and one end of the depletion layer enters the Ge layer 901. As in the second modified example of Example 1, it can be said that this example has the increased ratio of the electric field strength applied to the gap 620 and the gap 621.

Example 3

Figure 10:
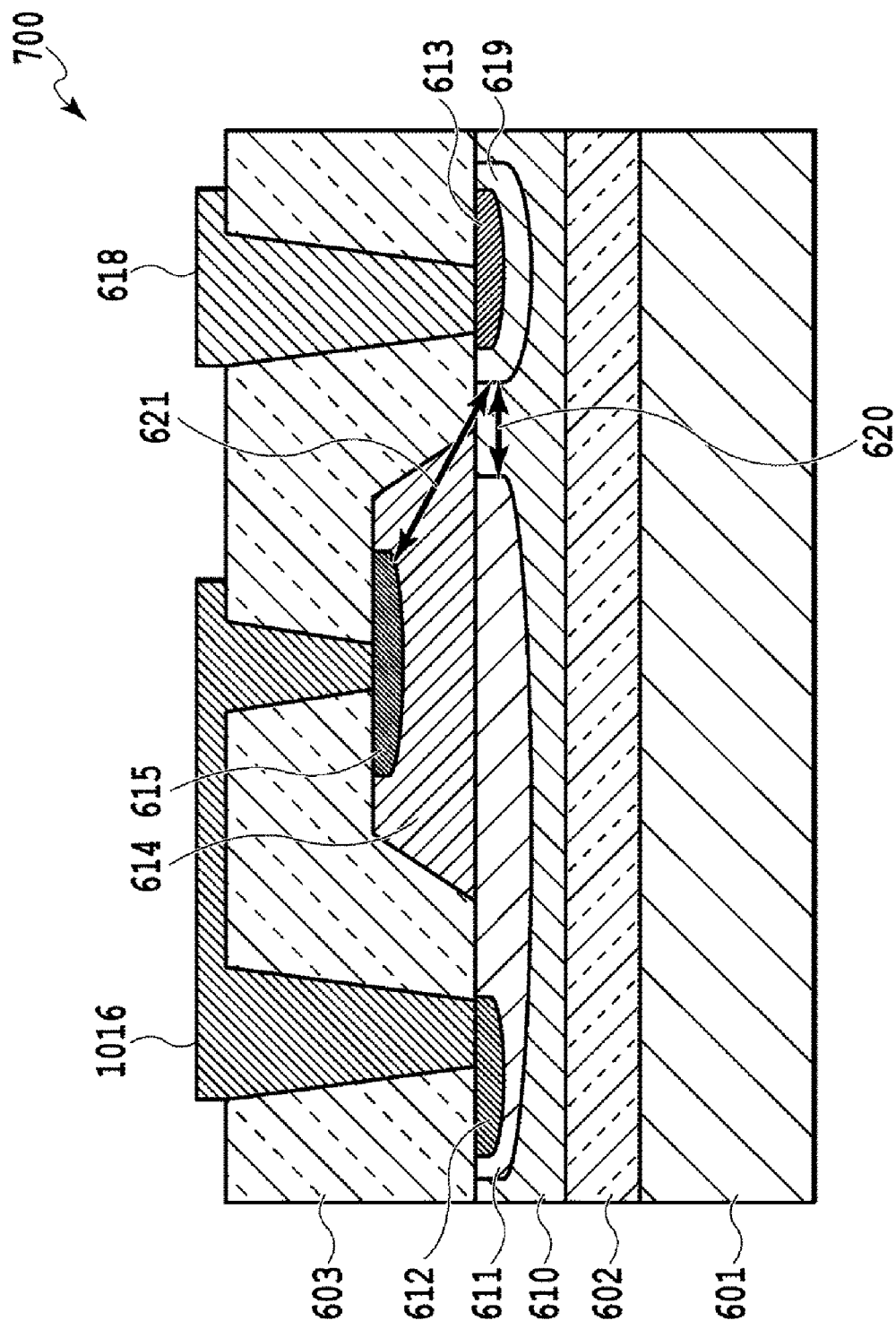
FIG. 10 is a diagram showing a configuration of a GeAPD of Example 3.

FIG. 10 shows a configuration of a GeAPD of Example 3. The GeAPD 700 has the same configuration of Example 1 shown in FIG. 6 except that the electrode 616 and the electrode 617 are short-circuited to form one electrode 1016. Compared to the configuration of Example 1, the number of terminals is reduced, and thus mounting cost is reduced.

On the other hand, since the voltage applied to the silicon electrode portion 612 and the Ge region 615 cannot be individually controlled, it is not possible to individually control the electric fields applied to each of the gap 621 and the gap 620. The electric field strength at the gap 621 and gap 620 is controlled by a length of the gap 621 and the gap 620 and a thickness and a width of the Ge layer 614.

Example 4

Figure 11:
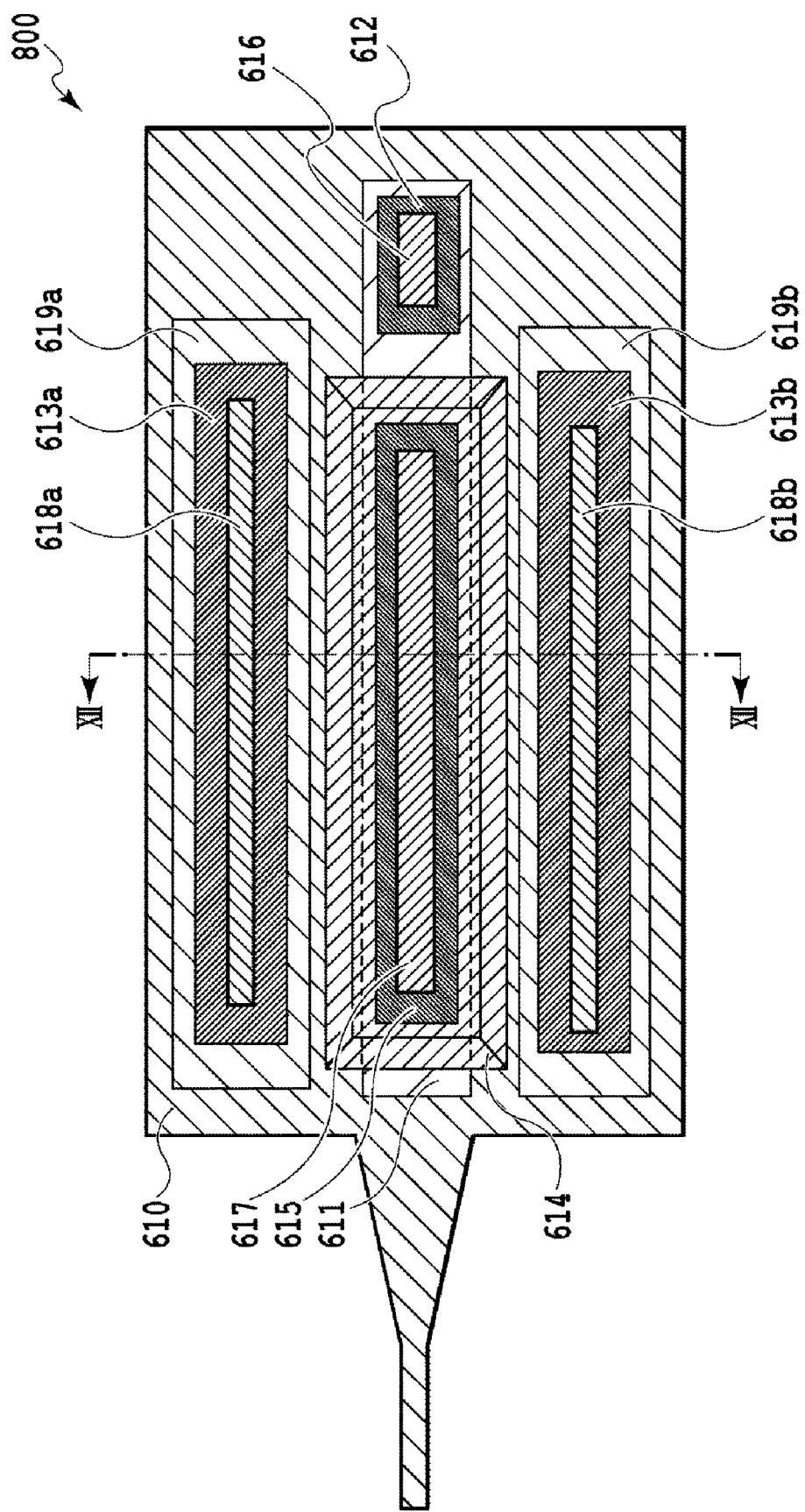
FIG. 11 is a diagram showing a structure of a GeAPD of Example 4.
Figure 12:
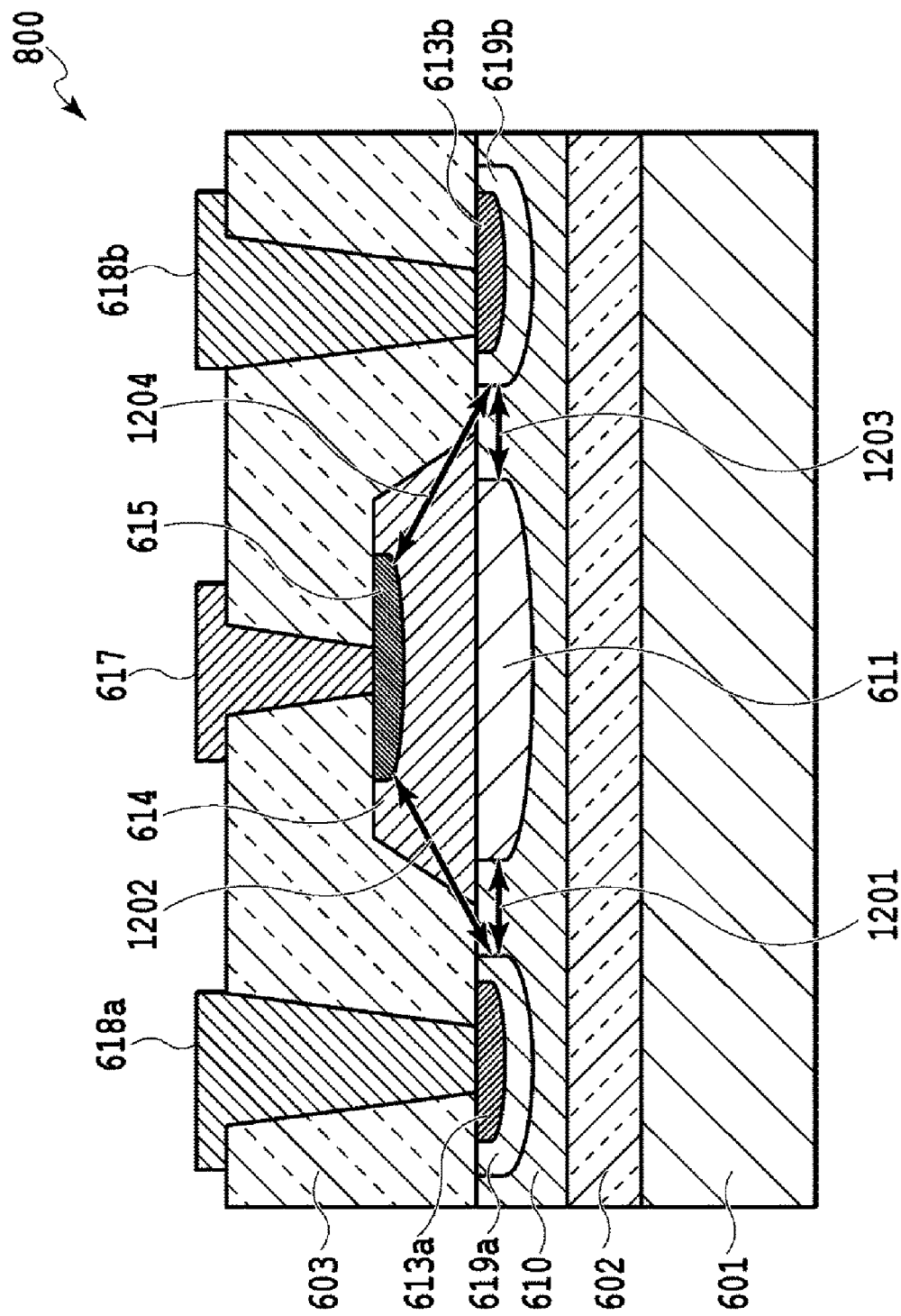
FIG. 12 is a cross-sectional view of the GeAPD shown in FIG. 11.

FIG. 11 shows a structure of a GeAPD of Example 4. FIG. 12 is a cross-sectional view of the GeAPD of FIG. 11 taken along a reference sign XII-XII. The GeAPD 800 is different from the GeAPD shown in each of Examples 1 to 3 in the configuration of the core layer 610. On the core layer 610, Si slabs 619a and 619b doped with the second conductive impurity ions and silicon electrode portions 613a and 613b doped with the second conductive impurity ions in a high concentration and serving as electrodes are formed, and the silicon electrode portion 613a is connected to a metal electrode 618a and the silicon electrode portion 613b is connected to a metal electrode 618b.

The Ge layer 614 has a Ge region 615 doped with the first conductive impurity ions, and a metal electrode 617 is connected thereto. Furthermore, a Si slab 611 doped with the first conductive impurity ions is formed immediately below the Ge layer 614. In a region in which the Si slab 611 is formed, a silicon electrode portion 612 doped with the first conductive impurity ions in a high concentration and serving as an electrode is formed separately from the Ge layer 614, and is connected to a metal electrode 616.

In order to make a structure easy to understand, the upper clad layer 603 is omitted and only positions at which the electrodes 616, 618a and 618b are in contact with the silicon electrode portions 612, 613a and 613b and the Ge region 615 are shown in FIG. 11. Also, the Ge layer 614 is omitted, and only a portion in contact with the core layer 610 is shown.

Compared to Example 1, the Si slabs 619a and 619b doped with the second conductive impurity ions are formed to extend over both ends (two facing sides) of a region in which the core layer 610 and the Ge layer 614 are in contact with each other. As a result, a region of the core layer sandwiched between the Si slabs 611 and 619 doped with the impurity ions is divided into two gaps 1201 and 1203, and two amplification layers are formed. In Example 1 shown in FIG. 6, when seen from the Ge layer 614, an end near the gap 620 and an end far from the gap 620 are created, and the electric field applied to the carriers absorbed in the vicinity of the end far from the gap 620 and the carriers absorbed in the vicinity of the end near the gap 620 is non-uniform.

In Example 4, a line symmetric structure with respect to the Ge layer 614 is formed, and electric fields are mainly applied to the regions of the gap 1202 and the gap 1204 in the Ge layer 614, and thus the above-described electric field deviation is not generated. A traveling time of the generated carriers is also shortened compared to Example 1.

On the other hand, electrodes which provide an electric potential to the Si slab 611 doped with the first conductive impurity ions cannot be disposed on both sides of the Ge layer 614. Thus, as shown in FIG. 11, the silicon electrode portion 612 and the electrode 616 are formed separately from the region in which the Ge layer 614 is formed to provide an electric potential to the Si slab 611.

The invention claimed is:

1. A photodetector comprising:
a silicon (Si) substrate;
a lower clad layer formed on the Si substrate;
a core layer formed on the lower clad layer, the core layer including a waveguide layer configured to guide signal light, and including a first Si slab doped with first conductive impurity ions and a second Si slab doped with second conductive impurity ions;
a germanium (Ge) layer formed on the core layer, the Ge layer configured to absorb light and including a Ge region doped with the first conductive impurity ions;
an upper clad layer formed on the core layer and the Ge layer; and
electrodes respectively connected to the first and second Si slabs and the Ge region,
wherein a region of the core layer sandwiched between the first and second Si slabs operates as an amplification layer,
wherein an electric field applied to a gap between the first and second Si slabs is stronger than an electric field applied to a gap between the Ge region and the second Si slab and causes avalanche amplification,
wherein the second Si slab is formed in a region other than immediately below a region in which the core layer and the Ge layer are in contact with each other,
wherein the region of the core layer is formed to extend over a line immediately below one side of the region in which the core layer and the Ge layer are in contact with each other.

2. The photodetector according to claim 1, wherein a Ge layer doped with the first conductive impurity ions is further inserted between the core layer or the first Si slab and the Ge layer.

3. The photodetector according to claim 1, wherein the electrode connected to the first Si slab and the electrode connected to the Ge region are short-circuited.

4. A photodetector comprising:
a silicon (Si) substrate;
a lower clad layer formed on the Si substrate;
a core layer formed on the lower clad layer, the core layer including a waveguide layer configured to guide signal light, and including a first Si slab doped with first conductive impurity ions and a second Si slab doped with second conductive impurity ions;
a germanium (Ge) layer formed on the core layer, the Ge layer configured to absorb light and including a Ge region doped with the first conductive impurity ions;
an upper clad layer formed on the core layer and the Ge layer; and
electrodes respectively connected to the first and second Si slabs and the Ge region,
wherein a region of the core layer sandwiched between the first and second Si slabs operates as an amplification layer,
wherein an electric field applied to a gap between the first and second Si slabs is stronger than an electric field applied to a gap between the Ge region and the second Si slab and causes avalanche amplification,
wherein the first Si slab is formed immediately below a region in which the core layer and the Ge layer are in contact with each other, and the region of the core layer is not formed immediately below the region in which the core layer and the Ge layer are in contact with each other.

5. A photodetector comprising:
a silicon (Si) substrate;
a lower clad layer formed on the Si substrate;
a core layer formed on the lower clad layer, the core layer including a waveguide layer configured to guide signal light, and including a first Si slab doped with first conductive impurity ions and a second Si slab doped with second conductive impurity ions;
a germanium (Ge) layer formed on the core layer, the Ge layer configured to absorb light and including a Ge region doped with the first conductive impurity ions;
an upper clad layer formed on the core layer and the Ge layer; and
electrodes respectively connected to the first and second Si slabs and the Ge region,
wherein the first Si slab is formed immediately below a region in which the core layer and the Ge layer are in contact with each other, and the two second Si slabs are formed in a region other than a region immediately below the region in which the core layer and the Ge layer are in contact with each other,
wherein a region of the core layer sandwiched between the first and each of the two second Si slabs operates as an amplification layer which is formed in two portions to extend over a line immediately below two facing sides of the region in which the core layer and the Ge layer are in contact with each other, and the same electric field is applied to each of the two portions,
wherein an electric field applied to each of the region of the core layer sandwiched between the first and the two second Si slabs that is stronger than the electric field applied to each of a region of the core layer sandwiched between the Ge region and the second Si Slabs and causes avalanche amplification.

* * * * *